(12) United States Patent
Kwak

(10) Patent No.: US 6,567,317 B2
(45) Date of Patent: May 20, 2003

(54) CONTROLLING OUTPUT CURRENT RAMBUS DRAM

(75) Inventor: Jong Tae Kwak, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/032,080

(22) Filed: Dec. 31, 2001

(65) Prior Publication Data

US 2002/0176309 A1 Nov. 28, 2002

(51) Int. Cl.[7] .............................. G11C 7/00; G11C 8/00
(52) U.S. Cl. ........................... 365/189.02; 365/230.02; 365/230.05
(58) Field of Search ....................... 365/189.02, 189.05, 365/230.02, 230.05, 230.08, 233, 236

(56) References Cited

U.S. PATENT DOCUMENTS

| | | | |
|---|---|---|---|
| 5,655,113 A | 8/1997 | Leung et al. | 713/401 |
| 5,729,152 A | 3/1998 | Leung et al. | 326/21 |
| 5,845,108 A | 12/1998 | Yoo et al. | 365/233 |
| 5,892,719 A | 4/1999 | Kanagawa | 365/200 |
| 5,970,016 A | 10/1999 | Ohsawa | 365/230.03 |
| 6,067,595 A * | 5/2000 | Lindenstruth | 365/230.05 |
| 6,178,126 B1 * | 1/2001 | Kirihata et al. | 365/230.05 |
| 6,182,184 B1 | 1/2001 | Farmwald et al. | 365/233 |
| 6,301,171 B2 * | 10/2001 | Kim et al. | 365/189.02 |

FOREIGN PATENT DOCUMENTS

| | | |
|---|---|---|
| JP | 11-144472 | 5/1999 |
| JP | 2000-010783 | 1/2000 |

* cited by examiner

Primary Examiner—Trong Phan
(74) Attorney, Agent, or Firm—Pillsbury Winthrop LLP

(57) ABSTRACT

Disclosed is a circuit for controlling output currents of the data ports in a Rambus DRAM having two data ports DQA and DQB. The disclosed circuit arrangements save power and require less chip 'real estate' than do known circuit arrangements. First and second current evaluation means output first and second control signals respectively by evaluating currents of the data ports DQA and DQB. A current control value producing means produces a next current control value for the data port DQA by receiving the first control signal and a present current control value of the data port DQA and producing another next current control value for the data port DQB by receiving the second control signal and a present current control value of the data port DQB. The current control value producing means repeats the process to produce the next current control values alternately, and first and second control value latch means for latching the respective current control values of the data ports DQA and DQB produced by the current control value producing means.

19 Claims, 8 Drawing Sheets

US 6,567,317 B2

CONTROLLING OUTPUT CURRENT RAMBUS DRAM

BACKGROUND

1. Field of Invention

The inventions described herein relate in general to circuits for controlling an output current of a Rambus DRAM. More particularly, they relate to an output current control circuit enabling reduction of circuit area and current consumption compared with known devices.

2. General Background and Related Art

FIG. 1 (Prior Art) is a block diagram of a known circuit arrangement for controlling output driving of a Rambus DRAM. An output current controller 10 produces a current control signal ictrl <0:6> that controls a current flow of an output driver by increasing or decreasing a current control counter. This is accomplished by measuring actual voltage levels VOH and VOL from a data port DQA. A gate voltage generator, VTG GNR 11 produces a gate voltage Vgate as a new voltage level. A gate voltage distributor 12 provides an upper device of the output driver with a voltage envg <0:6> attained by multiplexing a time clock enabling signal tclk enable and the current control signal ictrl <0:6> generated from voltage generator 11 in accordance with the gate voltage Vgate generated from voltage generator 11. A slew-rate controller 13 produces control codes sl1 and sl2 specifying a slew rate of an output regardless of power, voltage, and temperature. A phase splitter 14 generates clocks tclk1 and tclk1b having 180° difference from one another and based on an input time clock tclk. A MUX/predriver 15 outputs input data eread and oread, which are synchronized with the clocks tclk1 and tclk1b output from the phase splitter 14, to an output driver 16 in the form of voltages q and q1 to output driver 16, constituting a lower device of the output driver in accordance with the control codes sl1 and sl2 provided by the slew rate controller 13. Output driver 16 provides a pad PAD with a an appropriate current by providing a pull-down path of a Rambus signal logic(RSL) by turning on/off N-type MOS transistors in accordance with the voltage envg<0:6> distributed by the gate voltage distributor 12 and the voltages q and q1 output from the MUX/predriver 15.

In the output current controller 10 at an initial stage of active operation, actual current levels are measured from a pair of input pads DQA<4> and DQA<3>(not shown in the drawing) respectively. A count value is then decreased the output current control counter if the measured current levels are higher than a specific value, or the count value is then increased if the measured current levels are lower than the specific value. Thus, the output current controller 10 outputs the output current control signal ictrl<0:6>, which adjusts the number of turned-on transistors of the output driver 16 so as to satisfy an output current flow of the output driver 16, to the gate voltage distributor 12.

A time clock enabling signal tclk enable is input to the gate voltage distributor 12 from an external input. In this case, the gate voltage generator 11 provides the gate voltage distributor 12 with a gate voltage Vgate which is a voltage having a new level as a source power. Ultimately, the gate voltage distributor 12 receives the output current control signal ictrl <0:6> output from the output current controller 10, the time clock enabling signal tclk enable, and the gate voltage Vgate output from the voltage generator 11. The gate voltage distributor 12 multiplexes the current control signal ictrl <0:6> and time clock enabling signal tclk enable received by the output current controller 10, selects and outputs the gate voltage Vgate or a ground voltage VSS enabling to adjust the turning-on number in accordance with the multiplexed value, and then outputs it to the output driver 16.

FIG. 2 (Prior Art) is a schematic diagram including detailed circuits of the gate voltage distributor 12 and the output driver 16 shown in FIG. 1 (Prior Art). A Vgate voltage as a new voltage, which is produced by carrying out comparison and amplification on a reference voltage Vgref input to an inverting input (−) of an operational amplifier OP1 and a voltage input to a non-inverting input terminal (+) by being fed back from an output terminal, is output to an inverter I1. In this case, a NAND gate ND1 carries out a NAND operation on the current control signal ictrl <0:6> output from the current controller 10 and the time clock enabling signal tclk_enable and then provides the inverter I1 with them. The inverter I1 then inverts the output signal from NAND gate ND1 in a manner that the output driver 16 is provided with the gate enabling signal envg <0:6> having a gate voltage level using the gate voltage Vgate output from amplifier OP1 as a source if the signal output from the NAND gate ND1 is low or the gate enabling signal envg <0:6> having a ground voltage level using the ground voltage VSS as a source if the signal output from the NAND gate ND1 is high. Therefore, lower transistors Tr1 to Trn of the output driver 16 are turned on as many as the number of the gate enabling signals envg having the gate voltage level output from the inverter I1.

Receiving a time clock tclk form outside, the phase splitter 14 produces a pair of clocks tclk1 and tclkb having a 180° phase difference (see FIG. 1) and then provides the MUX/predriver 15 with the clocks tclk1 and tclkb. Even and odd data are input to the MUX/predriver 15 from outside. The slew-rate controller 13 (see FIG. 1) outputs the control codes sl1 and sl2 to the MUX/predriver 15 so as to fix a slew rate of an output regardless of power, voltage, and temperature. Therefore, the MUX/predriver 15 transmits the even data to the output driver 16 if receiving the clock tclk1 from the phase splitter 14 or the odd data to the output driver 16 if receiving the other clock tclk1b having a different phase (180° from tclk1).

Receiving the control codes sl1 and sl2 (shown in FIG. 1) from the slew-rate controller 13, the MUX/predriver 15 outputs the control voltages q and q1 to the output driver 16 so as to turn on/off the lower device of the output driver 16 such as the lower transistors. Transistors Tr1 to Trn as the upper device of the output driver 16 are turned on as many as the number adjusted by the output voltage envg <0:6> of the gate voltage distributor 12, while the other transistors T1 to Tn and Q1 to Qn as the lower device of the output driver 12 are turned on by the MUX/predriver 15 so as to form a pull-down path.

Capacitors 'C1' and 'C2' of the output driver 16 are decoupling capacitors preventing noise coupling. The upper and lower transistors become turned on so as to supply the corresponding pad with a satisfactory output current by adjusting an output of RSL (Rambus signaling level), that is a swing width, and carry output data on a channel.

Generally, a command, so-called current control, is carried out periodically in a Rambus DRAM so as to maintain a constant output current at a data port. The data port in Rambus DRAM is constructed with 8 bit buses DQA[7:0] and DQB[7:0] (not shown in FIG. 2). A known output current control circuit for controlling currents output from the data ports DQA[7:0] and DQB[7:0] constantly is explained by referring to FIG. 3 as follows.

FIG. 3 is a block diagram of the output current controller 10 shown in FIG. 1. An enabling signal CCEval becomes active ('high' when a 'current control command' is applied to a Rambus DRAM from a controller (not shown in the drawing). The output current controller 10 includes a first current detector 31 outputting a signal CClncrA having a 'low' value if a current flow received from a couple of the data ports (not shown in the drawing) DQA<4> and DQA<3> by the enabling signal CCEval is higher than a target value through a comparison therebetween or a signal CClncrA having a 'high' value if the current flow is lower than the target value. A first output current control counter 32 produces a signal cvalA_pre<6:0> of which control value of 7 bits is incremented by 1 than the currently-output current control signal ictrla<6:0> if the signal CClncrA received from the first current detector 31 or a signal cvalA_pre<6:0> of which control value of 7 bits is decremented by 1 than the currently-output current control signal if the signal CClncrA has a 'low' value. A first output current latch counter 33 latches the signal cvalA_pre<6:0> received from the first output current control counter 32 when a received control signal ccUpdata becomes active ('high') and produces the latched signal as the current control signal ictrla<6:0>.

Moreover, the output current controller 10 includes a second current detector 41 outputting a signal CClncrB having a 'low' value if a current flow received from a couple of the data ports (not shown in the drawing) DQA<4> and DQA<3> by the enabling signal CCEval is higher than a target value through a comparison therebetween or a signal CClncrB having a 'high' value if the current flow is lower than the target value, a second output current control counter 42 produces a signal cvalB_pre<6:0> of which control value of 7 bits is incremented by 1 than the currently-output current control signal ictrla<6:0> if the signal CClncrB received from the second current detector 41 or a signal cvalB_pre<6:0> of which control value of 7 bits is decremented by 1 than the currently-output current control signal if the signal CClncrB has a 'low' value, and a second output current latch counter 43 latching the signal cvalB_pre<6:0> received from the second output current control counter 42 when a received control signal ccUpdate becomes active ('high') and produces the latched signal as the current control signal ictrlb<6:0>.

The operation of output current controller 10 shown in FIGS. 1 and 3 (Prior Art) is explained by referring to an operational timing graph shown in FIG. 4 (Prior Art). The enabling signal CCEval becomes active as 'high' when the 'current control command' is applied to Rambus DRAM from the controller (not shown in the drawing). The first and second current detectors 31 and 41 controlled by the enabling signal CCEval are operated respectively so as to compare the current flow received from the two data ports DQA<3> and DQA<4> to the target vale. In this case, the signals CClncrA and CClncrB having 'low' values are output if the current flow received from the data ports DQA<4>/DQA<3> and DQB<4>/DQB<3> is higher than the target value so as to reduce a current flow output to the present data ports. If the current flow received from the data ports DQA<4>/DQA<3> and DQB<4>/DQB<3> is lower than the target value, the signals having 'high' values are output so as to increase the current flow output to the present data ports.

Subsequently, the first and second output current control counters 32 and 42, if the signals received respectively from the first and second current detectors 31 and 41 have 'high' values, produce the signals cvalA_pre<6:0> and cvalB_pre<6:0> of which control values of 7 bits are incremented by 1 than the currently-output current control signals ictrla<6:0> and ictrlb<6:0>. And, if the signals received respectively from the first and second current detectors 31 and 41 have 'low' values, the first and second output current control counters 32 and 42 produce the signals cvalA_pre<6:0> and cvalB_pre<6:0> of which control values of 7 bits are decremented by 1 than the currently-output current control signals ictrla<6:0> and ictrlb<6:0>.

The first and second output current latch counters 33 and 43, when the control signal ccUpdate is on a active state ('high'), latch the signals cvalA_pre<6:0> and cvalB_pre<6:0> received from the first and second output current control counters 32 and 42 so as to produce the current control signals ictrla<6:0> and ictrlb<6:0>.

Therefore, the output current controller 10 according to the related art increases or decreases the output current control counters by measuring actual current values from the two data ports DQA[7:0] and DQB7:[7:0], thereby enabling to control a current flow of the output driver 16.

Unfortunately, the output current controller 10 includes the first and second output current control counters 32 and 42 having the same function and construction for increasing or decreasing the control values of 7 bits using the signals CClncrA and CClncrB received from the first and second current detectors 31 and 41, which increases circuit area and power consumption.

SUMMARY

Among the inventions described in this patent document, there is detailed a circuit for controlling an output current in a Rambus DRAM that substantially obviates the disadvantages of the known circuit arrangements.

Provided herein are circuit arrangements that control an output current in a Rambus DRAM using less circuit area and current consumption compared with the known arrangements. This is accomplished in part by using a single output current control counter instead of a pair of first and second output current controllers 32 and 42 as in the known arrangements. Our arrangements also control the current of data ports DQA and DQB using multiplexing.

Additional features and advantages of the invention will become evident by reading the detailed description below in conjunction with the accompanying drawings.

Among the inventions described herein there is provided a circuit for controlling output currents of the data ports in a Rambus DRAM having two data ports DQA and DQB. First and second current evaluation means output first and second control signals respectively by evaluating currents of the data ports DQA and DQB. A current control value producing means produces a next current control value for the data port DQA by receiving the first control signal and a present current control value of the data port DQA and produces a next current control value for the data port DQB by receiving the second control signal and a present current control value of the data port DQB. The current control value producing means repeats the process to produce the next current control values alternately. First and second control value latch means latch the respective current control values of the data ports DQA and DQB produced by the current control value producing means.

According to another aspect of the inventions, there is provided a circuit for controlling output current in a Rambus DRAM, which is operated by responding to an enabling signal becoming active when a 'current control command' is applied to the Rambus DRAM from a controller. A first current detector produces a detection signal attained by comparing current flows received from first and second terminals of a first data port by the enabling signal to a predetermined target value. A second current detector produces a detection signal attained by comparing current flows received from first and second terminals of a second data port by the enabling signal to a predetermined target value. A first multiplexer selects one of the signals received from the first and second current detectors by a first control signal and outputs the selected signal. A second multiplexer selects one of first and second output current control signals by the first control signal and outputs the selected output current control signal. An output current control counter produces a signal incremented or decremented by '1 bit' from the signal received from the second multiplexer by the signal received from the first multiplexer. A first output current latch counter latches the signal received from the output current control counter by a second control signal and produces the latched signal as the first output current control signal. A second output current latch counter latches the signal received from the output current control counter by a third control signal and produces the latched signal as the second output current control signal.

The output current control circuit does not need to have the dedicated output current control counters for each of data ports DQA and DQB, as in known arrangements. Instead, the output current control circuit includes only one output current control counter, and generates output current control signals alternately for data ports DQA and DQB by using multiplexing technique. Therefore, it is possible to eliminate the redundancy, while the whole circuit performs the same operation. Although the present invention requires two additional multiplexers for performing multiplexing the related signals of the two data port DQA and DQB, the present invention is effective in reducing the chip area (compared with known arrangements) which is necessary to implement the entire circuit. That is because the area of one output current counter is much larger than that of two multipliers. The arrangements taught herein are effective in reducing the power consumption which is necessary to drive the circuit.

The foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
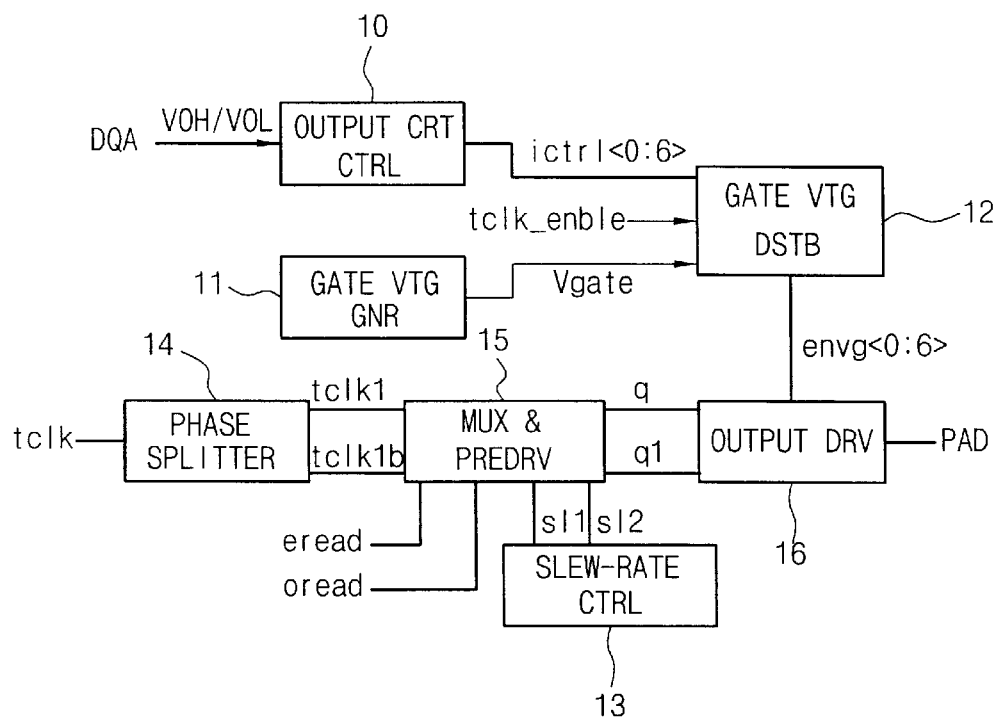
FIG. 1 (Prior Art) is a block diagram of a known circuit arrangement for controlling output driving of a Rambus DRAM.
Figure 2:
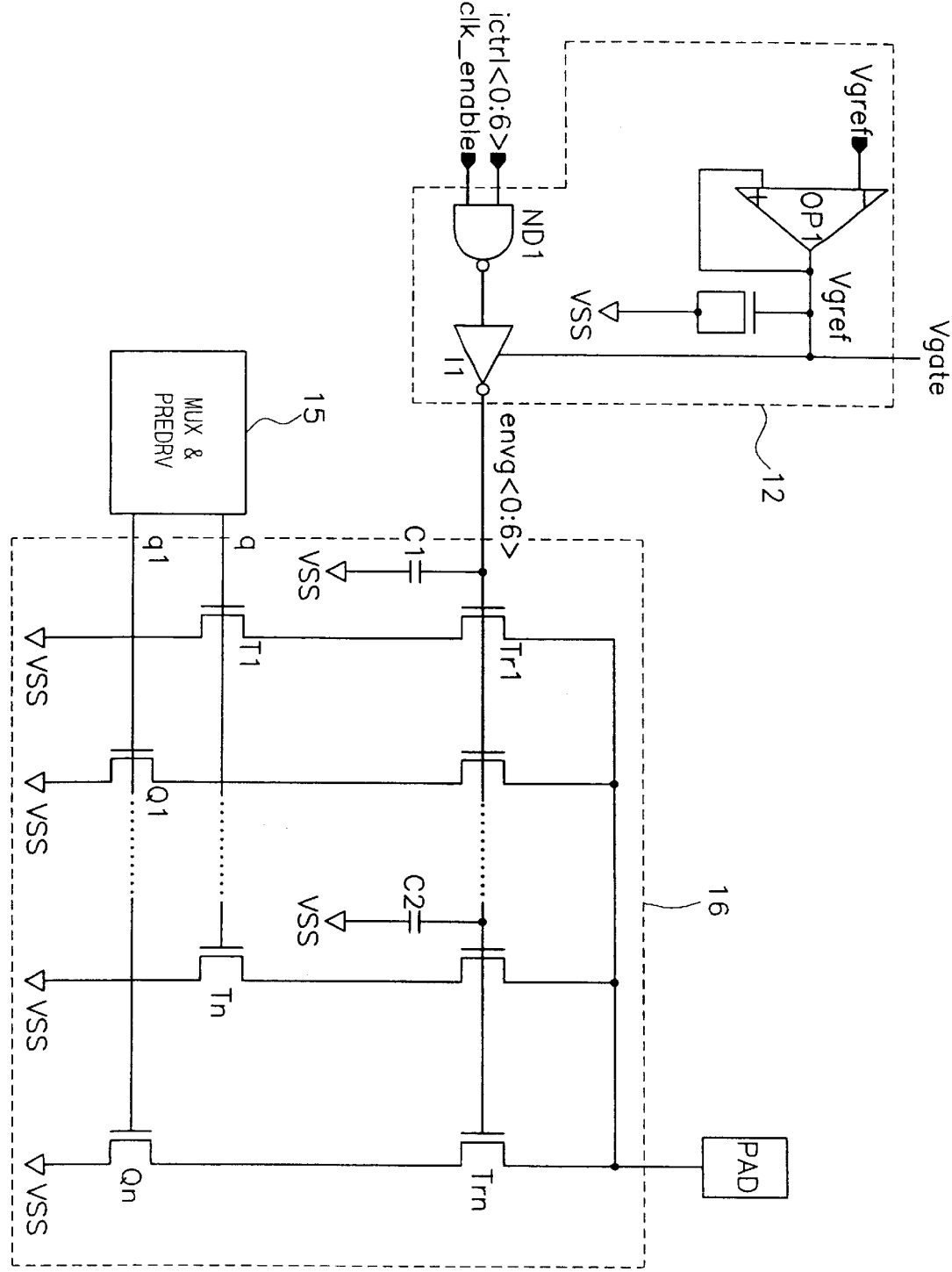
FIG. 2 (Prior Art) is a detailed circuit diagram of the gate voltage distributor and the output driver shown in FIG. 1 (Prior Art)
Figure 3:
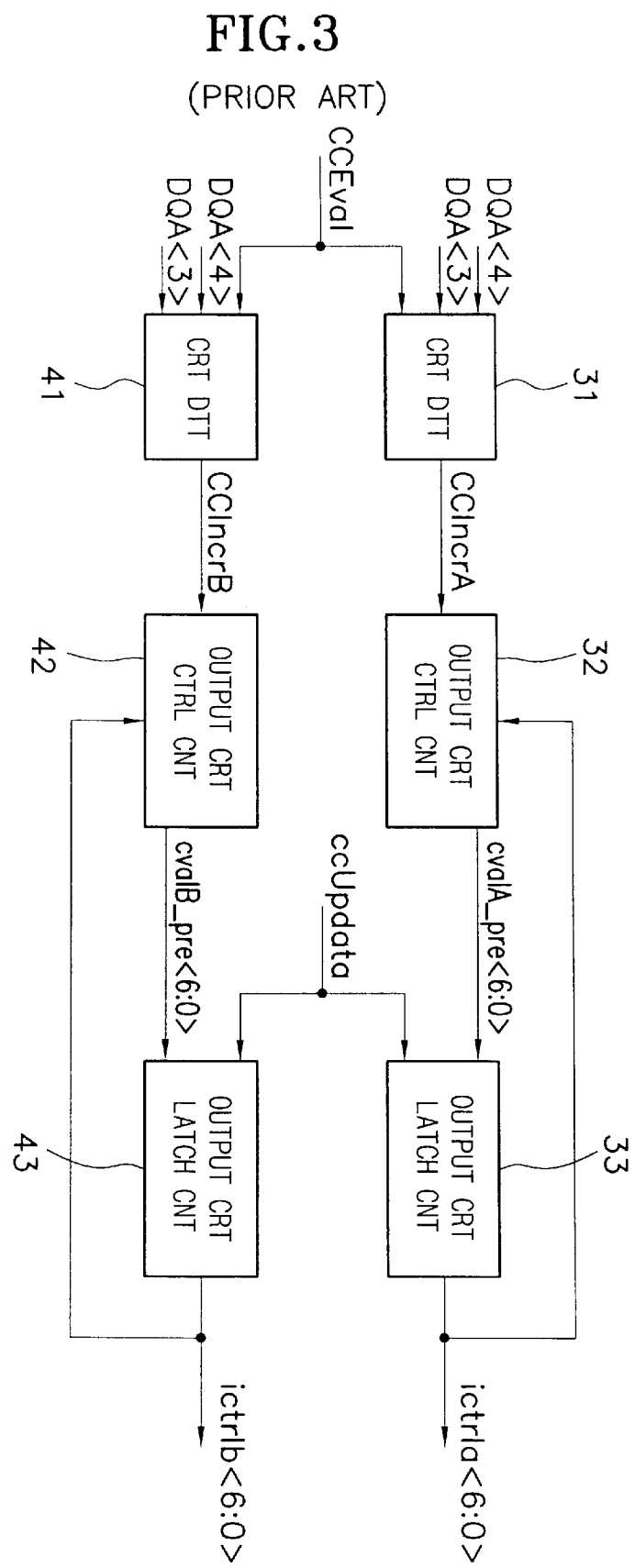
FIG. 3 (Prior Art) is a block diagram of the output current controller shown in FIG. 1 (Prior Art)
Figure 4:
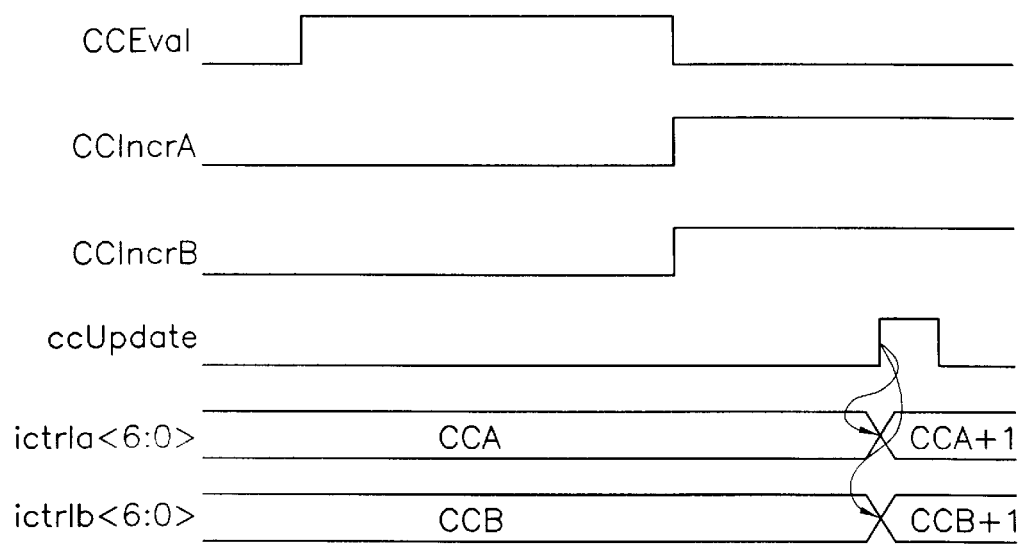
FIG. 4 (Prior Art) is a timing diagram explaining the operation of the output current controller shown in FIG. 2 (Prior Art)

Non-limiting presently preferred embodiments of the inventions will be explained in detail to enable practicing the inventions claimed herein. This description should be taken in conjuction with the drawings, together constituting the explanation of the inventions. Where possible, the same reference numerals are used to illustrate like elements throughout the specification.

It is intended to provide an explanation of a circuit for controlling an output current of data ports in a Rambus DRAM having data ports DQA and DQB.

Figure 5:
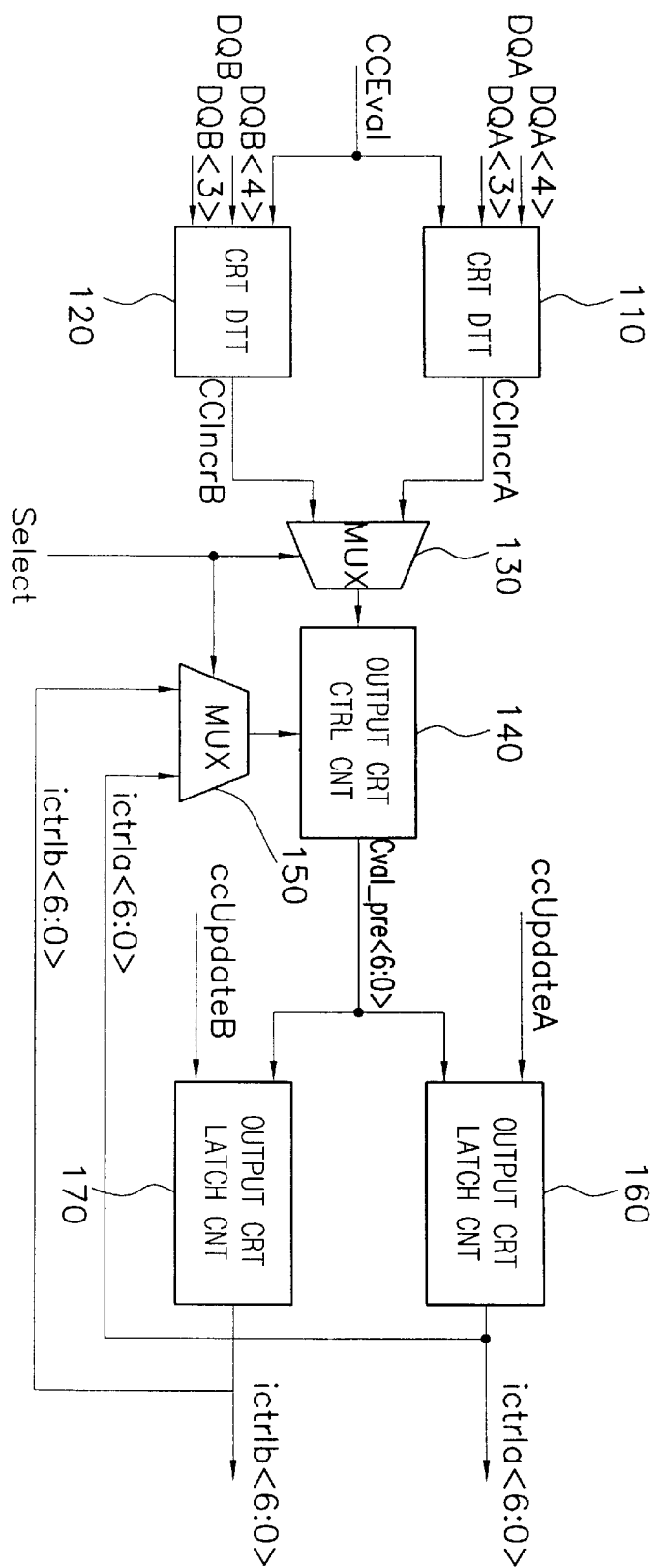
FIG. 5 is a block diagram of a circuit for controlling an output current in a Rambus DRAM according to the present invention.

FIG. 5 is a block diagram of a circuit for controlling output current of a Rambus DRAM according to the present invention. An enabling signal CCEval becomes active('high' when a 'current control command' is applied to a Rambus DRAM from a controller (not shown in the drawing). An output current controller according to the present invention includes a first current detector 110 outputting a signal CClncrA having a 'low' value if a current flow received from a pair of data ports (not shown in the drawing) DQA<4> and DQA<3> by the enabling signal CCEval is higher than a target value by a comparison therebetween or a signal CClncrA having a 'high' value if the current flow is lower than the target value. A second current detector 120 outputs a signal CClncrB having a 'low' value if a current flow received from a pair of data ports (not shown in the drawing) DQA<4> and DQA<3> by the enabling signal CCEval is higher than a target value by comparison therebetween or a signal CClncrB having a 'high' value if the current flow is lower than the target value. A first multiplexer 130 selects to output the signals CClncrA and CClncrB received from the first and second current detectors 110 and 120 responsive to a control signal Select. A second multiplexer 150 receives the output current control signals ictrla<6:0> and ictrlb<6:0> output and selects to output the signals responsive to the control signal Select. An output current control counter 140 produces a signal Cval_pre<6:0> of which bits are incremented/decremented by 1 from the signal ictrla<6:0> or ictrlb<6:0> received from the second multiplexer 150 by the signal CClncrA or CClncrB received from the first multiplexer 130. A first output current latch counter 160 latches the signal cvalA_pre<6:0> received from the output current control counter 140 when a first control signal ccUpdateA becomes active('high') and produces the latched signal as the current control signal ictrla<6:0>, and a second output current latch counter 170 latches the signal cvalB_pre<6:0> received from the second output current control counter 140 when the received control signal ccUpdateB becomes active('high') and produces the latched signal as the current control signal ictrlb<6:0>.

The enabling signal CCEval becomes active as 'high' when the 'current control command' is applied to Rambus DRAM from the controller (not shown in the drawing). The first and second current detectors 110 and 120 compare the current flow received from the two data ports DQA<4>/DQA<3> and DQB<4>/DQB<3> to the target vale. In this case, the signals CClncrA and CClncrB having 'low' values are output if the current flow received from the data ports DQA<4>/DQA<3> and DQB<4>/DQB<3> is higher than the target value so as to reduce a current flow output to the present data ports. If the current flow received from the data ports DQA<4>/DQA<3> and DQB<4>/DQB<3> is lower than the target value, the signals having 'high' values are output so as to increase the current flow output to the present data ports.

The first multiplexer 130 selects the signal CClncrA or CClncrB received from the first and second current detectors 110 and 120 by the control signal Select and outputs the selected signal to the output current control counter 140. In this case, the first multiplexer 130 controls the control signal('low') so as to output the signal CClncrA received from the first current detector 110 on an initial operation.

Figure 6A:
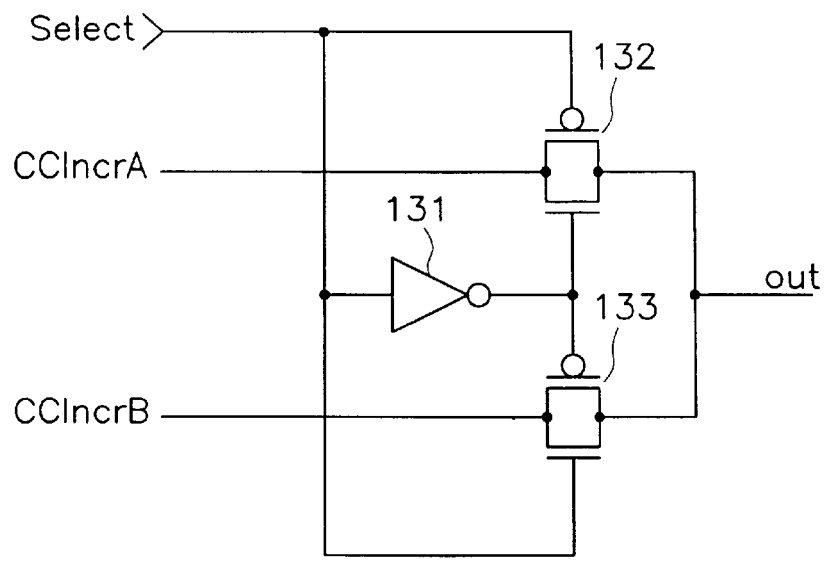
FIG. 6A and FIG. 6B are schematic circuit diagrams of the first and second multiplexers, respectively shown in FIG. 5.

FIG. 6A is a schematic circuit diagram of the first multiplexer 130 shown in FIG. 5. The first multiplexer 130 is constructed with a transfer gate 132 transmitting the signal CClncrA received from the first current detector 110 (see FIG. 5) to the output current control counter 140 (see FIG. 5) responsive to the control signal Select. Another transfer gate 133 transmits the signal CClncrB received from the second current detector 120 (see FIG. 5) to the output current control counter 140 (see FIG. 5) responsive to the control signal Select. Transfer gates 132 and 133, which are constructed with PMOS and NMOS transistors, are operated oppositely by the control signal Select and inverter 131.

Figure 6B:
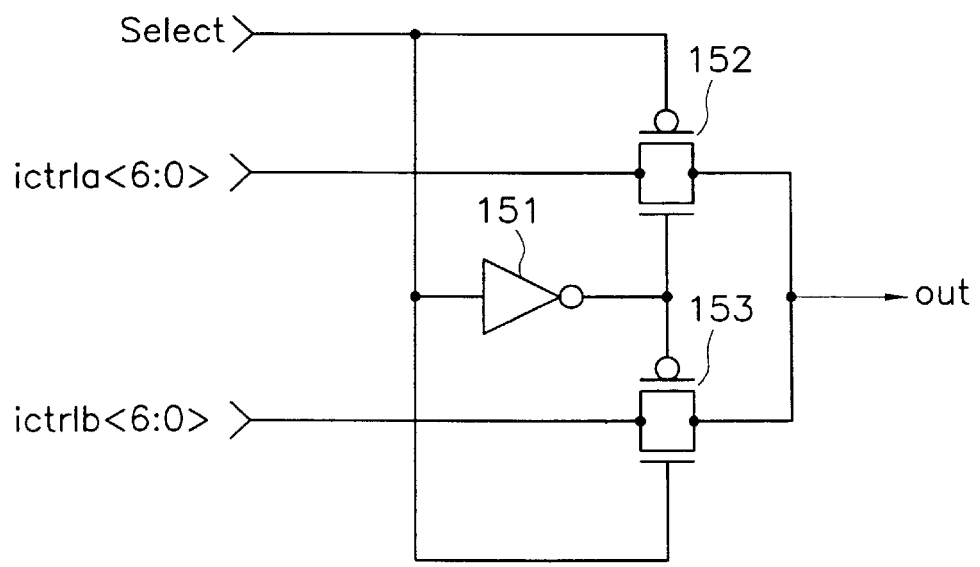

FIG. 6B is a schematic circuit diagram of the second multiplexers 150 shown in FIG. 5. The second multiplexer 150 receives the output current control signals ictrla<6:0> and ictrlb<6:0> output from the first and second output current latch counters 160 and 170 and then outputs the signal selected by the control signal Select to the output current control counter 140. In this case, the second multiplexer 150 controls the control signal Select('low') so that the output current control signal ictrlas<6:0> received from the first output current latch counter 160 is output therefrom on an initial operation.

The second multiplexer 150 is constructed with a transfer gate 152 transmitting the signal ictrla<6:0> received from the first output current latch counter 160 to the output current control counter 140 by the control signal Select and another transfer gate 153 transmitting the signal ictrlb<6:0> received from the second output current latch counter 170 to the output current control counter 140 responsive to the control signal Select. The transfer gates 152 and 153, which are constructed with PMOS and NMOS transistors, are operated oppositely by the control signal Select and inverter 151.

The output current control counter 140, when the signal CClncrA or CClncrb received from the first multiplexer 130 has a 'high' value, produces a signal Cval_pre<6:0> which is incremented by 1 bit from the signal ictrla<6:0> or ictrlb<6:0> received from the second multiplexer 150. And, the output current controller 140, when the signal CClncrA or CClncrb received from the first multiplexer 130 has a 'low' value, produces a signal Cval_pre<6:0> which is decremented by 1 bit from the signal ictrla<6:0> or ictrlb<6:0> received from the second multiplexer 150.

The first output current latch counter 160 latches the signal Cval_pre<6:0> received from the output current control counter 140 when the control signal ccUpdateA becomes active('high') and producing the latched signal as the current control signal ictrla<6:0>.

The second output current latch counter 170 latches the signal Cval_pre<6:0> received from the second output current control counter 140 when the received control signal ccUpdateB becomes active ('high') and producing the latched signal as the current control signal ictrlb<6:0>.

Figure 7:
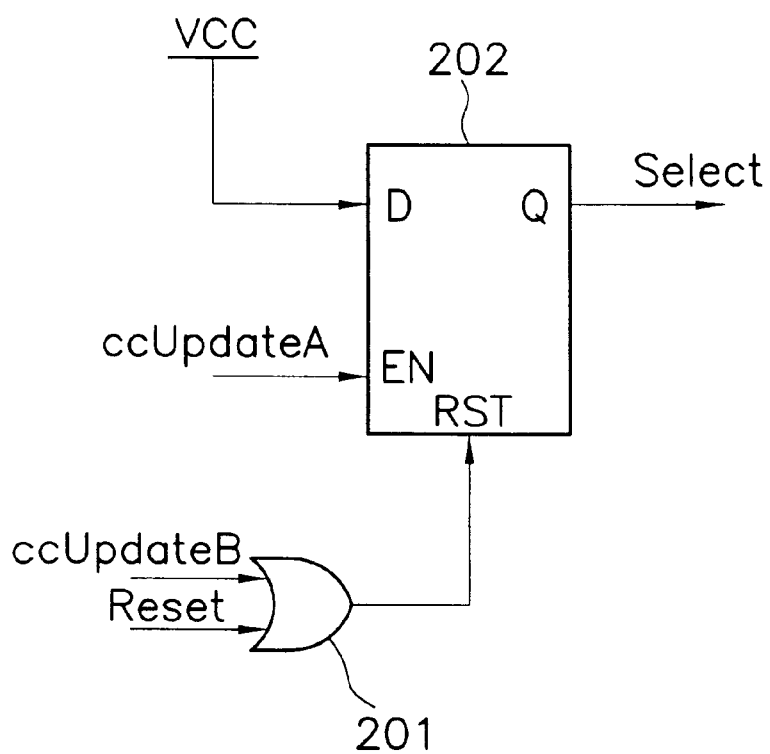
FIG. 7 is a schematic diagram of a control signal producing circuit for producing control signals of the first and second multiplexers shown in FIG. 5 and FIG. 6.

FIG. 7 is a schematic circuit diagram of a control signal producing circuit for producing control signals of the first and second multiplexers 130 and 150 shown in FIG. 5 and in FIGS. 6A and 6B, respectively.

An OR gate 201 receives the control signal ccUpdateB for updating the output current control signal ictrlb<6:0> toward the data port DQB and a reset signal as two inputs. A latch circuit 202 produces the control signal Select for the first and second multiplexers 130 and 150 by utilizing the signal from OR gate 201 as a reset signal RST. The control signal ccUpdateA updates the output current control signal ictrla<6:0> at the other data port DQA as an enabling signal EN. A power source voltage Vcc is input to the D port of latch circuit 202.

The control signal Select as the output signal of the latch circuit 202 is changed from '0(low)' to '1' as soon as the control signal ccUpdateA is changed into '1 (high)'. When the control signal ccUpdateB becomes '1', the latch circuit 202 resets. Thus, the control signal Select becomes initialized to '0' again.

Operation of the output current control circuit, as described above, is explained by referring to the attached drawings as follows.

A Rambus DRAM carries out a 'current control command' periodically(about 100 ms) so as to maintain a constant output current(about 30 mA) from the data ports DQA and DQB. Such an operation is carried out in a manner that a memory controller (not shown in the drawing) applies the current control command to the Rambus DRAM periodically from outside. When the memory controller applies the current control command to the Rambus DRAM, the current control enabling signal CCEval becomes active as 'high'. Once the current control enabling signal CCEval becomes 'high', the first and second current detectors 110 and 120 detecting currents of the data ports DQA and DQB respectively measure the present current flow with the voltage states of the data ports DQA<4>/DQA<3> and DQB<4>/DQB<3>. If the present current flow is less than the target value(about 30 mA), the detection signals CClncrA and CClncrB from the first and second current detectors 110 and 120 become '1'. If the present current flow is larger than the target value(about 30 mA), the detection signals CClncrA and CClncrB from the first and second current detectors 110 and 120 become '0'.

Meanwhile, the data port DQA is completely separated from the other data port DQB, whereby current flows of the data ports DQA and DQB may be different from each other. Thus, the detection signals CClncrA and CClncrB output from the first and second current detectors 110 and 120 may differ in values. When the detection signals CClncrA and CClncrB output from the first and second current detectors 110 and 120 are '1(high)', the output current control signals ictrla<6:0> and ictrla<6:0> controlling currents are increased since the present current flow is less than the target flow. On the other hand, when the detection signals CClncrA and CClncrB output from the first and second current detectors 110 and 120 are '0(low)', the output current control signals ictrla<6:0> and ictrla<6:0> controlling currents are decreased since the present current flow is larger than the target flow.

As shown in FIG. 5, the output current control counter 140, which increments or decrements the output current control signals ictrla<6:0> and ictrlb<6:0> controlling the currents of the respective data ports DQA and DQB one by one in accordance with the detection signals CClncrA and CClncrB, is singly constructed in the present invention, a significant savings in circuit 'real estate' from the known circuit arrangements. Also, the output current control counter 140 is constructed with the first and second multiplexers 130 and 150 so that the output currents of the data ports DQA and DQB are multiplexed by the control signal Select.

By setting the control signal Select as '0' in the initial stage, the operation of the first and second multiplexers 130 and 150 are controlled such that the output current control counter 140 receives the detection signal CClncrA output from the first detector 110 and the signal ictrla<6:0> output from the first output current latch counter 160.

The output current control counter 140 outputs the signal Cval_pre<6:0>, which is attained by incrementing(when CClncrA ='1') or decrementing (when CClncrA ='0') the present value of the output current control signal ictrla<6:0> received from the first output current latch counter 160 by '1' in accordance with the value of the detection signal CClncrA, to the first and second output current latch counter parts 160 and 170.

The first output current latch counter 160 latches the signal Cval_pre<6:0> received from the output current control counter 140 and updates the output current control signal ictrla<6:0> as an output signal as soon as the control signal ccUpdateA is changed into '1'. In this case, the second output current latch counter 170 fails to operate.

As shown in FIG. 7, the control signal Select changes from '0' to '1' the moment the control signal ccUpdateA for updating the output current control signal ictrla toward the data port DQA is changed into '1'. Thus, the detection signal CClncrB output from the second current detector 120 is transferred to the output current control counter 140 through the first multiplexer 130, and the output current control signal ictrlb<6:0> output from the second output current latch counter 170 is transferred to the output current control counter 140 through the second multiplexer 150. Therefore, the output current control counter 140 increments or decrements the value of the output current control signal ictrlb<6:0> output from the second output current latch counter 170 by 1 in accordance with the detection signal CClncrB output from the second current detector 120 and then outputs the incremented or decremented value. Subsequently, the second output control latch counter 170 latches the signal Cval_pre<6:0> received from the output current control latch 140 the moment the control signal ccUpdateB is changed into '1', and updates the output current control signal ictrla<6:0> which is an output signal.

As shown in FIG. 7, when the control signal ccUpdateB becomes '1', the latch circuit 202 is reset so as to initialize again the value of the control signal Select as '0'. This is for re-starting the updating though a path toward the data port DQA when the current control command is applied thereto again.

Figure 8:
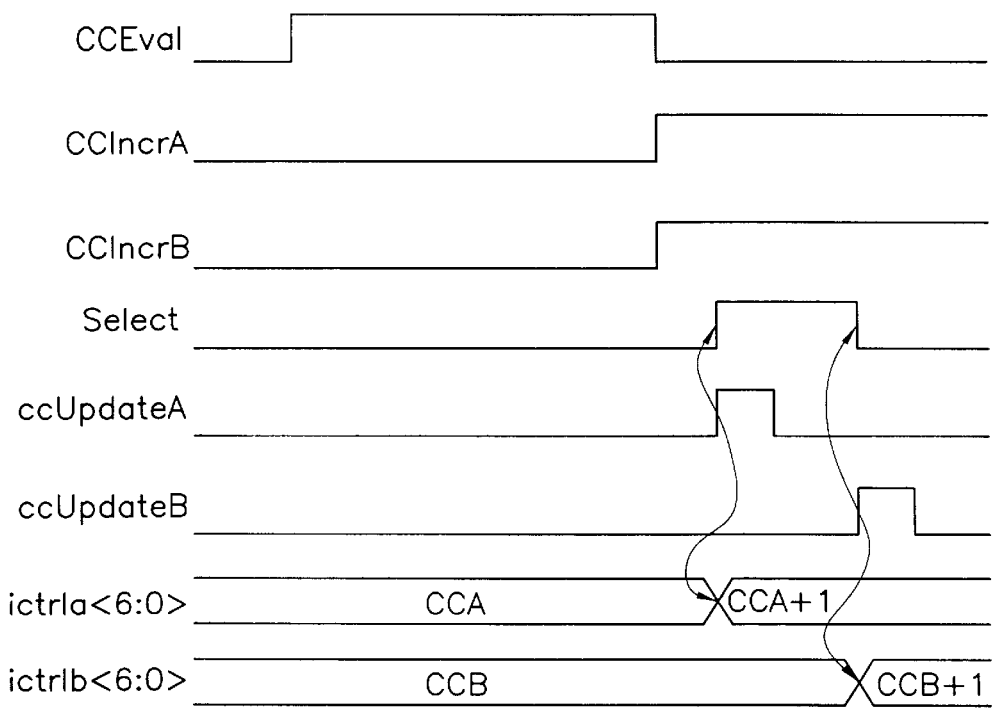
FIG. 8 is a timing diagram explaining operation of the output current controller shown in FIG. 5.

FIG. 8 is a timing diagram explaining operation of the output current controller shown in FIG. 5. New control values of which values are incremented by 1 than the previous control values ictrla<6:0> and ictrlb<6:0> since the detection values CClncrA and CClncrB output from the first and second current detectors 110 and 120 are '1'. These new control values are transferred to a block (not shown in the drawing) so as to adjust a current flow.

As illustrated in the drawing, the output current control signal ictrla<6:0> output from the first output current latch counter 160 is firstly updated. The output current control signal ictrlb<6:0> output from the second output current latch counter 170 is then updated. Hence, the output current control circuit according to the present invention requires only one output current control counter 140. Instead, the present invention uses the first and second multiplexers 130 and 150 such that the output currents of the data ports DQA and DQB are multiplexed by the control signal Select. In this case, the first and second multiplexers 130 and 150 are circuits occupying a very small area.

Therefore, the control circuit according to the present invention, compared with known circuit arrangements, require one less output current control counter, thereby reducing the required circuit area significantly and also reducing power consumption. Also, the time taken for updating both of the output current control signals ictrla<6:0> and ictrlb<6:0> in the output current control circuit of the present invention is equal to that of known circuit arrangements.

According to the above-mentioned present invention, the output current control circuit does not need to have the dedicated output current control counters for each of data ports DQA and DQB, as in the prior art. Instead of that, the output current control circuit includes only one output current control counter, and generates output current control signals alternately for data ports DQA and DQB by using multiplexing technique. Therefore, it is possible to eliminate the redundant part, while providing the same performance and saving power and circuit real estate. Although the present invention requires additional two multiplexers for performing multiplexing the related signals of the two data port DQA and DQB, the present invention is effective in reducing the chip area which is necessary to implement the entire circuit. That is because the area of one output current counter is much larger than that of two multipliers. And the present invention is effective in reducing the power consumption which is necessary to drive the circuit.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. In a Rambus DRAM having two data ports DQA and DQB, a circuit for controlling output currents of the data ports, comprising:

first and second current evaluation means for outputting first and second control signals respectively by evaluating currents of the data ports DQA and DQB;

a current control value producing means for producing a next current control value for the data port DQA by receiving the first control signal and a present current control value of the data port DQA and producing a next current control value for the data port DQB by receiving the second control signal and a present current control value of the data port DQB, the current control value producing means operating repetitively to produce the next current control values alternately; and first and second control value latch means for latching the respective current control values of the data ports DQA and DQB produced by the current control value producing means.

2. The circuit of claim 1, wherein the first and second current evaluation means evaluate currents of the respective data ports DQA and DQB only when a current control signal having a predetermined logic value is input thereto.

3. The circuit of claim 1, wherein the current control value producing means includes a multiplexer outputting signals alternately in accordance with a predetermined control signal by receiving the first control signal and the present current control value of the data port DQA, and the second control signal and the present current control value of the data port DQB, 4. In an output current control circuit in a Rambus DRAM operated by responding to an enabling signal becoming active when a 'current control command' is applied to the Rambus DRAM from a controller, a circuit for controlling output current in the Rambus DRAM, comprising:
   a first current detector producing a first detection signal attained by comparing current flows received from first and second terminals of a first data port in response to the enabling signal to a first predetermined target value;
   a second current detector producing a second detection signal attained by comparing current flows received from first and second terminals of a second data port in response to the enabling signal to a second predetermined target value;
   a first multiplexer selecting one of the first and second detection signals received from the first and second current detectors in response to a first control signal and outputting said one of the first and second detection signals;
   a second multiplexer selecting one of a first output current control signal and a second output current control signal in response to the first control signal and outputting the selected output current control signal;
   an output current control counter producing a signal incremented or decremented by '1 bit' from the signal received from the second multiplexer in response to the signal received from the first multiplexer;
   a first output current latch counter latching the signal received from the output current control counter in response to a second control signal and producing a latched signal as the first output current control signal; and
   a second output current latch counter latching the signal received from the output current control counter in response to a third control signal and producing a latched signal as the second output current control signal.

5. The circuit of claim 4, wherein the first current detector compares current flows received from the first and second terminals of the first data port to a target value in response to the enabling signal and then outputs a signal having a 'low' value if the current flows are larger than the target value or another signal having a 'high' value if the current flows are less than the target value.

6. The circuit of claim 4, wherein the second current detector compares current flows received from the first and second terminals of the second data port to a target value in response to the enabling signal and then outputs a signal having a 'low' value if the current flows are larger than the target value or another signal having a 'high' value if the current flows are less than the target value.

7. The circuit of claim 4, wherein the first multiplexer comprises:
   a first transfer gate transmitting the first detection signal received from the first current detector to the output current control counter at a first voltage level of the first control signal; and
   a second transfer gate transmitting the second detection signal received from the second current detector to the output current control counter at a second voltage level of the first control signal.

8. The circuit of claim 7, wherein the first and second transfer gates comprise PMOS and NMOS transistors, respectively and are operated oppositely by the first control signal.

9. The circuit of claim 4, wherein the second multiplexer comprises:
   a first transfer gate transmitting the latched signal received from the first output current latch counter to the output current control counter at a first voltage level of the first control signal; and
   a second transfer gate transmitting the latched signal received from the second output current latch counter to the output current control counter at a second voltage level of the first control signal.

10. The circuit of claim 9, wherein the first and second transfer gates comprise PMOS and NMOS transistors, respectively and are operated oppositely by the first control signal.

11. The circuit of claim 7 or claim 9, wherein the first control signal controls the first and second multiplexers on an initial operation so that the output current control counter receives the first detection signal output from the first current detector and the first output current control signal output from the first output current latch counter part.

12. The circuit of claim 11, wherein the first control signal has a 'low' voltage level on an initial operation.

13. The circuit of claim 4, wherein a first control signal producing circuit producing the first control signal comprises an OR gate having a third control signal and a reset signal as two inputs and a latch circuit producing the first control signal by receiving signals received from the OR gate as a reset signal, a second control signal as an enabling signal EN, and a power source voltage Vcc as an input signal.

14. The circuit of claim 13, wherein, in the first control signal producing circuit, the first control signal is changed from a 'low' voltage level to a 'high' voltage level as soon as the second control signal is changed into the 'high' voltage level and wherein the latch circuit becomes reset when the third control signal becomes 'high' so that the first control signal becomes initialized into 'low' again.

15. The circuit of claim 4, wherein the output current control counter produces a signal attained by incrementing the selected output current control signal received from the second multiplexer by '1 bit' when the signal received from the first multiplexer has a first voltage level and wherein the output current control counter produces a signal attained by decrementing the signal received from the second multiplexer by '1 bit' when the signal received from the first multiplexer has a second voltage level.

16. The circuit of claim 4, wherein the first output current latch counter latches the signal received from the output current control counter when the second control signal has the first voltage level and produces the latched signal as the first output current control signal.

17. The circuit of claim 16, wherein the first voltage level is a 'high' voltage level.

18. The circuit of claim 4, wherein the second output current latch counter latches the signal produced by the output current control counter when a third control signal has the first voltage level and produces the latched signal as the second output current control signal.

19. The circuit of claim 18, wherein the first voltage level is a 'high' voltage level.

* * * * *